(12) United States Patent
Tuttle et al.

(10) Patent No.: US 7,272,374 B2
(45) Date of Patent: Sep. 18, 2007

(54) DYNAMIC SELECTION OF LOCAL OSCILLATOR SIGNAL INJECTION FOR IMAGE REJECTION IN INTEGRATED RECEIVERS

(75) Inventors: G. Tyson Tuttle, Austin, TX (US); Dan B. Kasha, Salt Lake City, UT (US); Donald A. Kerth, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 277 days.

(21) Appl. No.: 10/881,579

(22) Filed: Jun. 30, 2004

(65) Prior Publication Data

US 2006/0003722 A1    Jan. 5, 2006

(51) Int. Cl.
*H04B 1/28* (2006.01)

(52) U.S. Cl. ............... 455/333; 455/209; 455/258; 455/260; 455/265

(58) Field of Classification Search ............ 455/280, 455/283, 285, 150.1, 151.1, 151.2, 333, 142, 455/146, 147, 205–208, 209, 230, 255–260, 455/265, 313–316, 323
See application file for complete search history.

(56) References Cited

U.S. PATENT DOCUMENTS

| 3,931,578 A | 1/1976 | Gittinger ................ 325/461 |
| 4,484,221 A | 11/1984 | Tults ................... 358/191.1 |
| 4,551,856 A | 11/1985 | Victor et al. ............. 455/183 |
| 5,369,790 A * | 11/1994 | Yokota .................. 455/164.1 |
| 5,752,174 A | 5/1998 | Matai et al. ............ 455/183.1 |
| 5,850,598 A * | 12/1998 | Behrent .................. 455/324 |
| 5,983,088 A | 11/1999 | Aschwanden ........... 455/188.2 |
| 6,205,183 B1 | 3/2001 | Dent ...................... 375/261 |
| 6,370,368 B1 | 4/2002 | Kianush ................. 455/264 |
| 6,442,380 B1* | 8/2002 | Mohindra ............. 455/234.1 |
| 6,539,066 B1 | 3/2003 | Heinen ................... 375/334 |
| 6,567,654 B1 | 5/2003 | Coronel Arredondo et al. ........ 455/315 |
| 6,597,789 B1* | 7/2003 | Glaab .................... 380/220 |
| 6,625,424 B1* | 9/2003 | Mohindra ................ 455/84 |
| 6,647,075 B1 | 11/2003 | Genrich .................. 375/316 |
| 6,766,148 B1* | 7/2004 | Mohindra ................ 455/73 |
| 6,876,839 B2 | 4/2005 | Harris .................... 455/141 |
| 2002/0081990 A1* | 6/2002 | Asikainen et al. ......... 455/324 |
| 2003/0165203 A1* | 9/2003 | Mohindra ................ 375/324 |
| 2004/0183610 A1* | 9/2004 | Seppinen et al. ........ 311/177 V |
| 2005/0143040 A1 | 6/2005 | Kerth et al. ............. 455/302 |

OTHER PUBLICATIONS

Allegri et al., "Single-Chip PLL-FM-Receiver," Swiss Federal Institute of Technology Zurich, Integrated Systems Laboratory, Winter Semester 1997/98, pp. 1-124.

(Continued)

*Primary Examiner*—Edward F. Urban
*Assistant Examiner*—Nhan T. Le
(74) *Attorney, Agent, or Firm*—O'Keefe, Egan, Peterman & Ender, LLP

(57) ABSTRACT

A system and method are disclosed for dynamically selecting high-side injection or low-side injection of local oscillator mixing signals based upon an assessment of signal power within the input signal spectrum that could cause unwanted images in the processed signal. This image rejection assessment provides an advantageous basis upon which to make dynamic high-side versus low-side injection determinations.

22 Claims, 11 Drawing Sheets

OTHER PUBLICATIONS

Philips Semiconductor Data Sheet No. TEA5711; TEA5711T, "AM/FM Stereo Radio Circuit," Sep. 1994.

Philips Semiconductor Data Sheet No. TEA5767HN, "Low-Power FM Stereo Radio For Handhald Applications," Nov. 12, 2003.

Philips Semiconductor Preliminary Data Sheet No. TEA5880TS, "Integrated FM Stereo Radio IC For Host Processor Tuning In Handheld Applications—Rev. 02," Apr. 26, 2004.

Copending U.S. Appl. No. 10/881,926, filed Jun. 30, 2004, "Integrated Low-IF Terrestrial Audio Broadcast Receiver And Associated Method".

Copending U.S. Appl. No. 10/880,483, filed Jun. 30, 2004, "Ratiometric Clock Systems For Integrated Receivers And Associated Methods".

* cited by examiner

DYNAMIC SELECTION OF LOCAL OSCILLATOR SIGNAL INJECTION FOR IMAGE REJECTION IN INTEGRATED RECEIVERS

TECHNICAL FIELD OF THE INVENTION

This invention relates to receiver architectures for radio-frequency communications. More particularly, the present invention relates to local oscillators and related mixing signals for integrate receivers.

BACKGROUND

Radio frequency (RF) receivers are used in a wide variety of applications such as television, cellular telephones, pagers, global positioning system (GPS) receivers, cable modems, cordless phones, radios and other devices that receive RF signals. RF receivers typically require frequency translation or mixing. For example, with respect to FM audio broadcasts, FM radio receivers may translate one broadcast channel in the FM frequency band to an intermediate frequency. Within the United States, FM radios will typically translate FM audio signals, which are broadcast in 200 KHz channels in the frequency band from 88 MHz to 108 MHz, to an intermediate frequency of 10.7 MHz. FM demodulators and stereo decoders can then convert this 10.7 MHz IF signal to demodulated left and right audio signal that can be sent to stereo speakers. Although other countries will have different frequency bands and channel spacing, the reception of audio broadcast signals, such as FM audio broadcasts, is similarly accomplished using RF receivers.

The majority of typical RF receivers perform frequency translation or mixing using an oscillator and an analog multiplier or mixer. An oscillator will typically output a local oscillator (LO) signal in the form of a sine wave or periodic wave having a tuned frequency ($f_{LO}$). A mixer then mixes the RF input signal spectrum, which includes desired spectral content at a target channel having a particular center frequency ($f_{CH}$), with the LO signal to form an output signal having spectral content at frequencies equal to the sum and difference of the two input frequencies, namely $f_{CH}+f_{LO}$ and $f_{CH}-f_{LO}$. One of these components forms the channel center frequency translated to the desired IF frequency, and the other component can be filtered out. The oscillator can be implemented with a variety of circuits, including, for example, a tuned inductor-capacitor (LC) oscillator, a charge relaxation oscillator, or a ring oscillator.

Many receiver systems operate by implementing either high-side injection or low-side injection of the LO mixing signal into the mixer to mix the input signal spectrum to the desired IF frequency. In particular, a mixer in a standard receiver system will mix a channel within a signal spectrum to a desired IF frequency in accordance with the equation $f_{CH}-f_{LO}=f_{IF}$, if low-side injection is utilized, and in accordance with the equation $f_{LO}-f_{CH}=f_{IF}$, if high-side injection is utilized. Most receiver systems do not provide the ability to switch between high-side injection and low-side injection during operation. Some prior systems, however, have attempted to select between high-side and low-side injection during operation by assessing the level of noise or spurs in the tuned channel once it has been received and processed. This solution, however, looks at the result of the LO injection selection and does not take into consideration potential images that could be caused by signal power within the signal spectrum not located at the frequency of the channel to be tuned.

SUMMARY OF THE INVENTION

The present invention provides a system and method for dynamically selecting high-side injection or low-side injection of the local oscillator mixing signals based upon an assessment of signal power within the input signal spectrum that could cause unwanted images in the processed signal. This image rejection assessment of the present invention provides an advantageous basis upon which to make dynamic high-side injection versus low-side injection determinations.

In one embodiment, the present invention is a method for dynamically selecting high-side or low-side injection of local oscillator mixing signals to help reject images within a receiver, including providing a mixer configured to utilize a mixing signal to mix an input signal to a desired frequency, receiving an RF signal spectrum including a plurality of channels, identifying a channel within the RF signal spectrum to be tuned, assessing signal power at one or more frequencies within the RF signal spectrum that are different from the frequency of the channel to be tuned, selecting high-side injection or low-side injection for the mixing signal based upon the signal power assessment, generating a high-side local oscillation (LO) signal if high-side injection is selected, generating a low-side local oscillation (LO) signal if low-side injection is selected, and mixing the RF signal spectrum with the local oscillation signal that was selected and generated so as to mix the channel to be tuned down to the desired frequency.

In another embodiment, the present invention is an integrated receiver, including a mixer coupled to receive an RF signal spectrum and a mixing signal as inputs and having a mixed signal as an output where the RF signal spectrum includes a plurality of channels, local oscillator (LO) generation circuitry configured to provide an oscillation signal as an output where the oscillation signal is used to generate the mixing signal for the mixer, conversion circuitry coupled to receive the mixed signal from the mixer and configured to output a digital signal, digital-signal-processor (DSP) circuitry coupled to receive the digital signal from the conversion circuitry and configured to output a tuned digital signal where the DSP circuitry including signal power determination circuitry, and control circuitry coupled to the DSP and to the LO generation circuitry where the control circuitry is configured to receive signals from the signal power determination circuitry, to receive a channel selection signal, to select high-side or low-side injection based upon a signal power assessment of one or more frequencies within the RF signal spectrum, and to control the LO generation circuitry to provide a high-side LO signal or a low-side LO signal depending upon the injection selection.

DESCRIPTION OF THE DRAWINGS

It is noted that the appended drawings illustrate only exemplary embodiments of the invention and are, therefore, not to be considered limiting of its scope, for the invention may admit to other equally effective embodiments.

DETAILED DESCRIPTION OF THE INVENTION

The present invention provides a system and method for dynamically selecting high-side injection or low-side injection of the local oscillator mixing signals based upon an assessment of signal power within the input signal spectrum that could cause unwanted images in the processed signal.

Figure 1A:
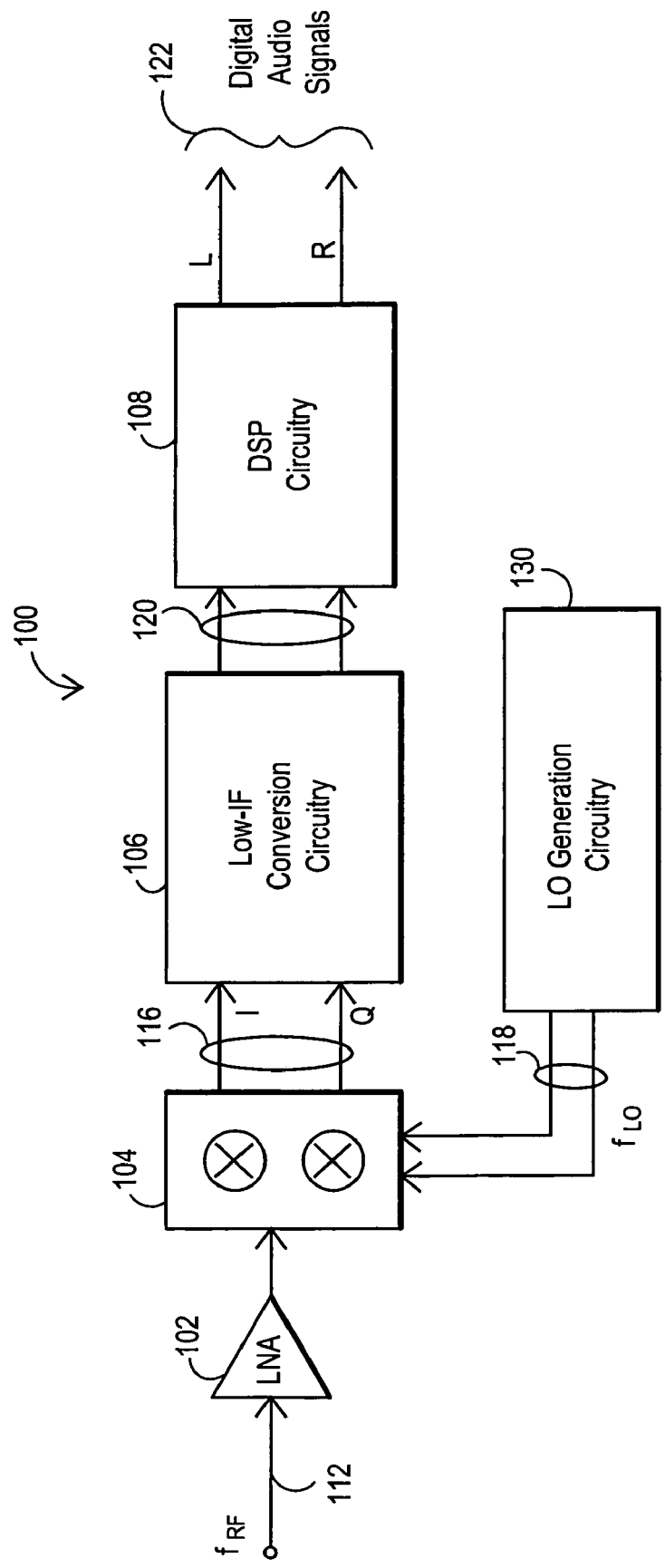
FIG. 1A is a block diagram of an embodiment for an integrated terrestrial broadcast receiver that utilizes a low-IF architecture.

FIG. 1A is a block diagram of an embodiment 100 for an integrated terrestrial broadcast receiver that utilizes a low-IF architecture. The input signal spectrum ($f_{RF}$) 112 is expected to be a radio frequency (RF) signal spectrum that includes a plurality of channels that can be tuned. It is noted that as used herein, a "radio frequency" or RF signal means an electrical signal conveying useful information and having a frequency from about 3 kilohertz (kHz) to thousands of gigahertz (GHz), regardless of the medium through which such signal is conveyed. Thus an RF signal may be transmitted through air, free space, coaxial cable, fiber optic cable, etc. More particularly, the present invention can provide an advantageous architecture for an FM terrestrial broadcast receiver. For purposes of the description below, therefore, the RF signal spectrum ($f_{RF}$) 112 will be discussed primarily with respect to the RF signal spectrum ($f_{RF}$) 112 being an FM terrestrial broadcast spectrum that includes a plurality of different FM broadcasts channels centered at different broadcast frequencies.

Looking back to the embodiment 100 in FIG. 1A, a low noise amplifier (LNA) 102 receives the RF signal spectrum ($f_{RF}$) 112. The output of the LNA 102 is then applied to mixer 104, and mixer 104 generates real (I) and imaginary (Q) output signals, as represented by signals 116. To generate these low-IF signals 116, the mixer 104 uses phase shifted local oscillator (LO) mixing signals ($f_{LO}$) 118. The LO generation circuitry 130 includes oscillation circuitry and outputs the two out-of-phase LO mixing signals ($f_{LO}$) 118 that are used by the mixer 104. The outputs of mixer 104 are at a low-IF, which can be designed to be fixed or may be designed to vary, for example, if discrete step tuning is implemented for the LO generation circuitry 130. An example of large step LO generation circuitry that utilizes discrete tuning steps is described in the co-owned and co-pending U.S. patent application Ser. No. 10/412,963, which was filed Apr. 14, 2003, which is entitled "RECEIVER ARCHITECTURES UTILIZING COARSE ANALOG TUNING AND ASSOCIATED METHODS," and which is hereby incorporated by reference in its entirety.

Low-IF conversion circuitry 106 receives the real (I) and imaginary (Q) signals 116 and outputs real and imaginary digital signals, as represented by signals 120. The low-IF conversion circuitry 106 preferably includes band-pass or low-pass analog-to-digital converter (ADC) circuitry that converts the low-IF input signals to the digital domain. And the low-IF conversion circuitry 106 provides, in part, analog-to-digital conversion, signal gain and signal filtering functions. Further digital filtering and digital processing circuitry with the digital signal processing (DSP) circuitry 108 is then used to further tune and extract the signal information from the digital signals 120. The DSP circuitry 108 then produces baseband digital output signals 122. When the input signals relate to FM broadcasts, this digital processing provided by the DSP circuitry 108 can include, for example, FM demodulation and stereo decoding. And the digital output signals 122 can be left (L) and right (R) digital audio output signals 122 that represent the content of the FM broadcast channel being tuned, as depicted in the embodiment 100 of FIG. 1A. It is noted that the output of the receiver 100 can be other desired signals, including, for example, low-IF quadrature I/Q signals from an analog-to-digital converter that are passed through a decimation filter, a baseband signal that has not yet been demodulated, multiplexed L+R and L−R audio signals, L and R analog audio signals, and/or any other desired output signals.

It is noted that as used herein low-IF conversion circuitry refers to circuitry that in part mixes the target channel within the input signal spectrum down to a fixed IF frequency, or down to a variable IF frequency, that is equal to or below about three channel widths. For example, for FM broadcasts within the United States, the channel widths are about 200 kHz. Thus, broadcast channels in the same broadcast area are specified to be at least about 200 kHz apart. For the purposes of this description, therefore, a low-IF frequency for FM broadcasts within the United States would be an IF frequency equal to or below about 600 kHz. It is further noted that for spectrums with non-uniform channel spacings, a low-IF frequency would be equal to or below about three steps in the channel tuning resolution of the receiver circuitry. For example, if the receiver circuitry were configured to tune channels that are at least about 100 kHz apart, a low-IF frequency would be equal to or below about 300 kHz. As noted above, the IF frequency may be fixed at a particular frequency or may vary within a low-IF range of frequencies, depending upon the LO generation circuitry 130 utilized and how it is controlled.

It is further noted that the architecture of the present invention can be utilized for receiving signals in a wide variety of signal bands, including AM audio broadcasts, FM audio broadcasts, television audio broadcasts, weather channels, and other desired broadcasts. The following table provides example frequencies and uses for various broadcast bands that can be received by the integrated terrestrial broadcast receiver of the present invention.

TABLE 1

EXAMPLE FREQUENCY BANDS AND USES

| FREQUENCY | USES/SERVICES |
|---|---|
| 150–535 kHz | European LW radio broadcast<br>9 kHz spacing |
| 535–1700 kHz | MW/AM radio broadcast<br>U.S. uses 10 kHz spacing<br>European uses 9 kHz spacing |
| 1.7–30 | SW/HF international radio broadcasting |
| 46–49 | Cordless phones and 'baby monitors', remote control |
| 59.75 (2) | U.S. TV Channels 2–6 (VHF_L) |
| 65.75 (3) | 6 MHz channels at 54, 60, 66, 76, 82 |
| 71.75 (4) | Audio carrier is at 5.75 MHz (FM MTS) |
| 81.75 (5) | |
| 87.75 (6) | |
| 47–54 (E2) | European TV |
| 54–61 (E3) | 7 MHz channels, FM sound |
| 61–68 (E4) | Band I: E2–E4 |
| 174–181 (E5) | Band III: E5–E12 |
| 181–188 (E6) | |
| 188–195 (E7) | |
| 195–202 (E8) | |
| 202–209 (E9) | |
| 209–216 (E10) | |
| 216–223 (E11) | |
| 223–230 (E12) | |
| 76–91 | Japan FM broadcast band |
| 87.9–108 | U.S./Europe FM broadcast band<br>200 kHz spacing (U.S.)<br>100 kHz spacing (Europe) |
| 162.550 (WX1) | U.S. Weather Band |
| 162.400 (WX2) | 7 channels, 25 kHz spacing |
| 162.475 (WX3) | SAME: Specific Area Message Encoding |
| 162.425 (WX4) | |
| 162.450 (WX5) | |
| 162.500 (WX6) | |
| 162.525 (WX7) | |
| 179.75 (7) | U.S. TV Channels 7–13 (VHF_High)<br>6 MHz channels at 174, 180, 186, 192, 198, 204, 210 |
| 215.75 (13) | FM Sound at 5.75 MHz |
| 182.5 (F5) | French TV F5–F10 Band III<br>8 MHz channels |
| 224.5 (F10) | Vision at 176, 184, 192, 200, 208, 216 MHz<br>AM sound at +6.5 MHz |
| 470–478 (21) | Band IV - TV Broadcasting<br>Band V - TV Broadcasting |
| 854–862 (69) | 6 MHz channels from 470 to 862 Mhz<br>UK System I (PAL):<br><br>Offsets of +/−25 kHz may be used to alleviate co-channel interference<br>AM Vision carrier at +1.25 (Lower Sideband vestigial)<br>FMW Sound carrier at +7.25<br>Nicam digital sound at +7.802<br>French System L (Secam):<br><br>Offsets of +/−37.5 kHz may be used.<br>AM Vision carrier at +1.25 (inverted video)<br>AM Sound carrier at +7.75<br>Nicam digital sound at +7.55 |
| 470–476 (14) | U.S. TV Channels 14–69<br>6 MHz channels |
| 819–825 (69) | Sound carrier is at 5.75 MHz (FM MTS)<br>14–20 shared with law enforcement |

Figure 1B:
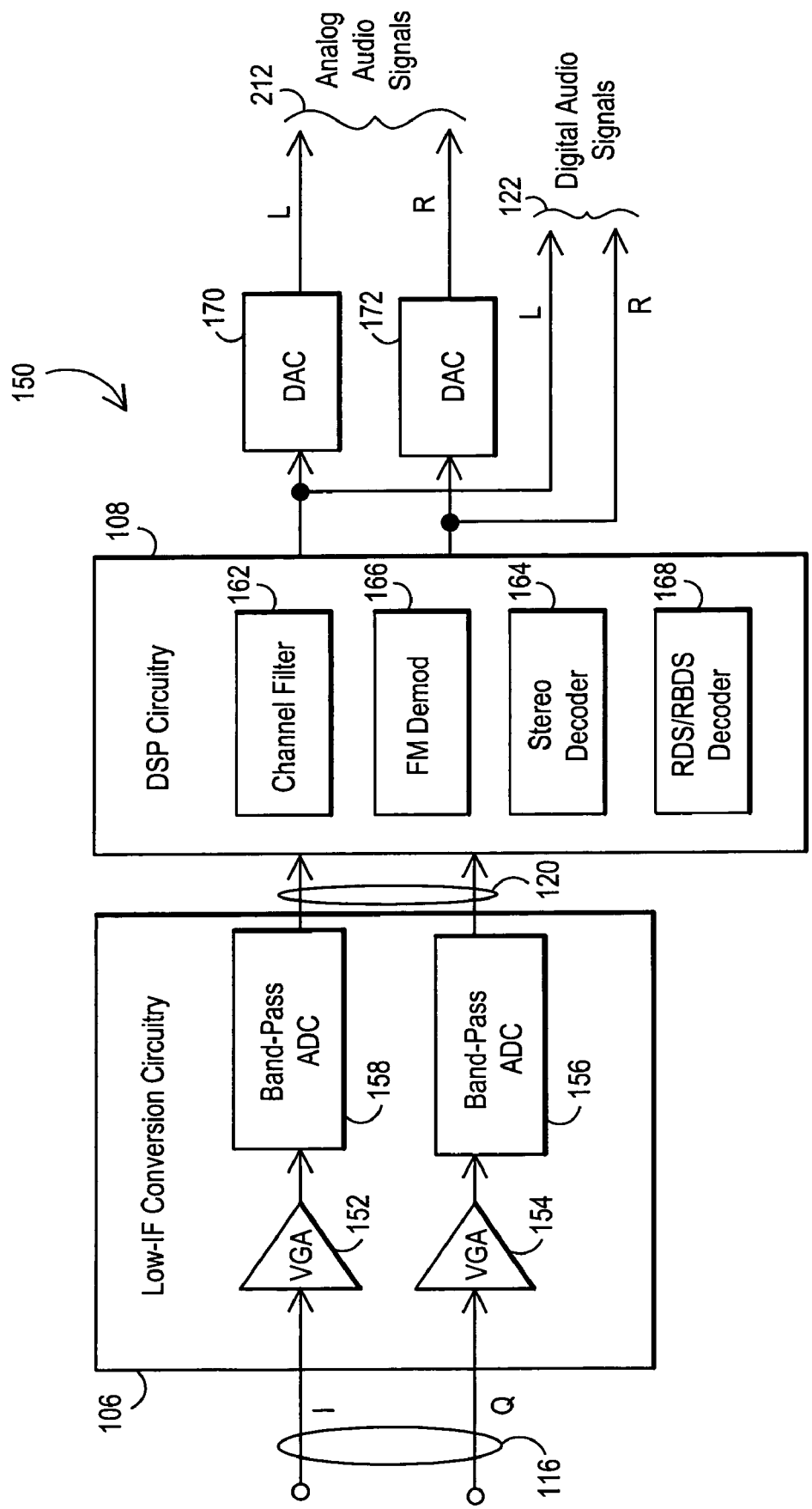
FIG. 1B is a more detailed block diagram for circuit blocks in FIG. 1A.

FIG. 1B is a more detailed block diagram for the low-IF circuitry 106 and the DSP circuitry 108 of FIG. 1A where the receiver circuitry is utilized for an integrated FM terrestrial broadcast receiver. More particularly, in the embodiment 150 of FIG. 1B, the low-IF circuitry 106 includes variable gain amplifiers (VGAs) 152 and 154 that receive the real (I) and imaginary (Q) signals 116 that have been mixed down to a low-IF frequency by mixer 104. The output of VGA 152 is then converted from low-IF to the digital domain using band-pass ADC 158. Similarly, the output of VGA 154 is converted from low-IF to the digital domain using band-pass ADC 156. Together, the ADCs 156 and 158 produce the real (I) and imaginary (Q) digital output signals 120. The DSP circuitry 108 conducts digital processing in the digital domain to further tune the target channel. More particularly, the low-IF DSP circuitry 108 utilizes a channel selection filter, as represented by the channel filter block 162, to further tune the target channel. As indicated above, the DSP circuitry 108 can also implement digital processing to provide FM demodulation of the tuned digital signals, as represented by FM DEMOD block 166, and can implement stereo decoding, such as MPX decoding, as represented by stereo decoder block 164. In addition, embodiment 150 can tune and decode RDS (Radio Data System) and/or RBDS (radio broadcast data System) information utilizing in part the RDS/RBDS decoder 168 within the DSP circuitry 108. The output signals from the low-IF DSP circuitry 108 are left (L) and right (R) digital audio signals 122. If desired, integrated digital-to-analog converters (DACs), such as DACs 170 and 172, can be utilized to convert these digital audio signals to left (L) and right (R) analog audio signals 212. It is also noted that, if desired, ADCs 156 and 158 could also be implemented as complex bandpass ADCs, as real low-pass ADCs, or as any other desired ADC architecture.

As indicated above, the architectures of the present invention are advantageous for small, low-cost portable devices and are particularly advantageous for such devices that need to receive terrestrial audio broadcasts, such as FM broadcasts. In particular, the LO generation circuitry 130, the mixer 104, the low-IF conversion circuitry 106 and the DSP circuitry 108 are preferably all integrated on the same integrated circuit. In addition, the LNA 102 and other desired circuitry can also be integrated into the same integrated circuit. This integrated circuit can be made, for example, using a CMOS process, a BiCMOS process, or any other desired process or combination of processes. In this way, for example, a single integrated circuit can receive a terrestrial broadcast signal spectrum and output digital or analog audio signals related to a tuned terrestrial broadcast channel. Preferably, the integrated circuit is a CMOS integrated circuit, and preferably an integrated CMOS terrestrial broadcast receiver of the present invention is configured in a 4×4 mm 24-pin micro lead-frame (MLP) package to provide advantageous cost, size and performance features for small, portable devices, such as cellular handsets, portable audio devices, MP3 players, portable computing devices, and other small, portable devices.

Power consumption is an additional concern with such small, portable devices. The integrated receiver architecture of the present invention advantageously provides for reduced power consumption and allows for the use of power supplies with different ranges to power the integrated receiver. In particular, the present invention allows for low current consumption of less than or equal to 30 mA (milli-Amps) of supply current. In addition, the level of integration provided by the present invention allows for a small package size and reduced number of external components that is less than or equal to about six (6) external components.

Figure 1C:
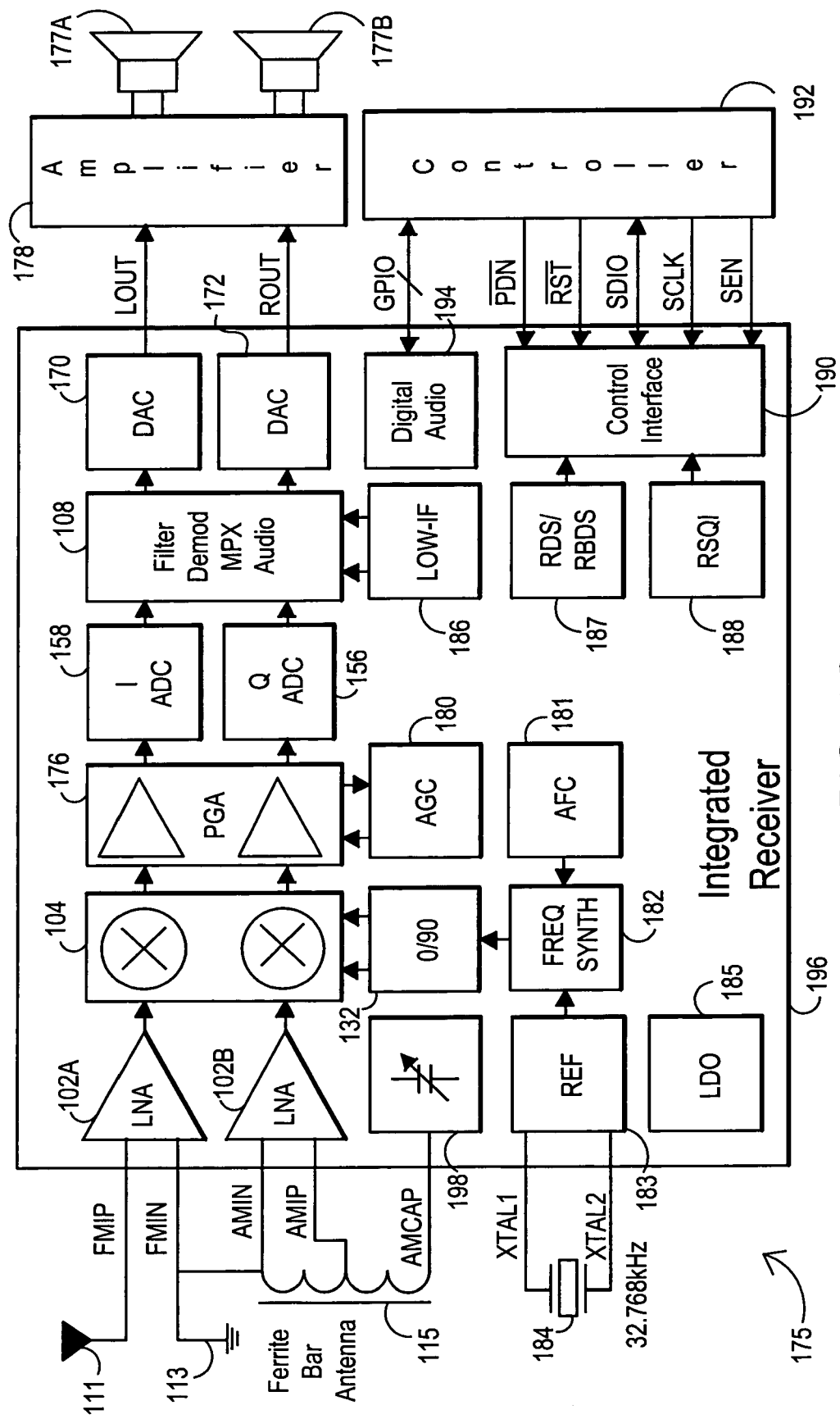
FIG. 1C is a block diagram of one example implementation for an integrated terrestrial broadcast receiver including example external components.

FIG. 1C is a block diagram of one example embodiment 175 for an integrated terrestrial broadcast receiver 196. In the embodiment depicted, the integrated receiver 196 includes an AM antenna and an FM antenna. The FM antenna 111 provides a differential FM input signal, which is represented by signals FMIP (FM input positive) and FMIN (FM input negative), to a first low noise amplifier (LNA) 102A. The FMIN node is coupled to ground 113. The AM antenna 115 provides a differential AM input signal, which is represented by signals AMIP (AM input positive) and AMIN (AM input negative), to a second low noise amplifier (LNA) 102B. The AMIN node is coupled to ground 113. The AM antenna 115, as depicted, is a ferrite bar antenna, and the AM reception can be tuned using an on-chip variable capacitor circuit 198. The connection between the on-chip variable capacitor circuit 198 and the AM antenna 115 is represented by the AMCAP signal. It is also noted that the FM antenna reception can also be tuned with an on-chip variable capacitor circuit, if desired. With respect to the power supply for the integrate receiver 196, an integrated supply regulator (LDO) block 185 can be provided to help regulate the on-chip power.

As with FIG. 1A, the outputs of the LNAs 102A and 102B are processed by mixer 104 to generate real (I) and an imaginary (Q) signals. These signals are then processed by a programmable gain amplifier (PGA) 176, which is controlled by the automatic gain control (AGC) block 180. The output signals from the PGA 176 are then converted to digital I and Q values with I-path ADC 158 and Q-path ADC 156. DSP circuitry 108 then processes the digital I and Q values to produce left (L) and right (R) digital audio output signals that can be provided to the digital audio block 194. In addition, these left (L) and right (R) digital audio output signals can be processed with additional circuitry, as represented by digital-to-analog conversion (DAC) circuits 170 and 172, to produce left (LOUT) and right (ROUT) analog output signals. These analog output signals can then be output to listening devices, such as headphones. Amplifier 178 and speaker outputs 177A and 177B, for example, can represent headphones for listening to the analog audio output signals. As described above with respect to FIG. 1B, the DSP circuitry 108 can provide a variety of processing features, including digital filtering, FM and AM demodulation (DEMOD) and stereo/audio decoding, such as MPX decoding. Low-IF block 186 includes additional circuitry utilized to control the operation of the DSP circuitry 108 in processing the digital I/Q signals.

A digital control interface 190 can also be provided within integrated receiver 196 to communicate with external devices, such as controller 192. As depicted, the digital communication interface includes a power-down (PDN_) input signal, reset (RST_) input signal, a bi-directional serial data input/output (SDIO) signal, a serial clock input (SCLK) signal, and a serial interface enable (SEN) input signal. As part of the digital interface, digital audio block 194 can also output digital audio signals to external devices, such as controller 192. As depicted, this communication is provided through one or more general programmable input/output (GPIO) signals. The GPIO signals represent pins on the integrated receiver 196 that can be user programmed to perform a variety of functions, as desired, depending upon the functionality desired by the user. In addition, a wide variety of control and/or data information can be provided through the interface 190 to and from external devices, such as controller 192. For example, a RDS/RBDS block 187 can report relevant RDS/RBDS data through the control interface 190. And a receive strength quality indicator block (RSQI) 188 can analyze the receive signal and report data concerning the strength of that signal through the control interface 190. It is noted that other communication interfaces could be used, if desired, including serial or parallel interfaces that use synchronous or asynchronous communication protocols.

Looking back to the mixer 104 of FIG. 1C, LO mixing signals are received by mixer 104 from a phase shift block (0/90) 132 that produces two mixing signals that are 90 degrees out of phase with each other. The phase shift block 132 receives an oscillation signal from frequency synthesizer (FREQ SYNTH) 182. Frequency synthesizer 182 receives a reference frequency from reference frequency (REF) block 183 and a control signal from automatic frequency control (AFC) block 181. An external crystal oscillator 184, operating, for example, at 32.768 kHz, provides a fixed reference clock signal to the reference frequency (REF) block 183 through connections XTAL1 and XTAL2. The AFC block 181 can receive tuning error signal from the receive path circuitry within the integrate receiver 196 and provide a correction control signal to the frequency synthesizer 182. The use of such an error correction signal is discussed in further detail below.

FIGS. 2A, 2B, 3A and 3B will now be discussed. These figures provide additional embodiments for receivers according to the present invention that utilize ratiometric clock systems for mixing circuitry and digital circuitry located on the same integrated circuit. The generated clock signals are deemed ratiometric because the are all divisors or multiples of at least one common clock signal. As discussed below, such ratiometric clock signals can be generated by first producing a base oscillation signal that is then utilized to generate a plurality of dependent clock signals through dividers or multipliers, such that the clock signals are all ratiometric with respect to each other.

Figure 2A:
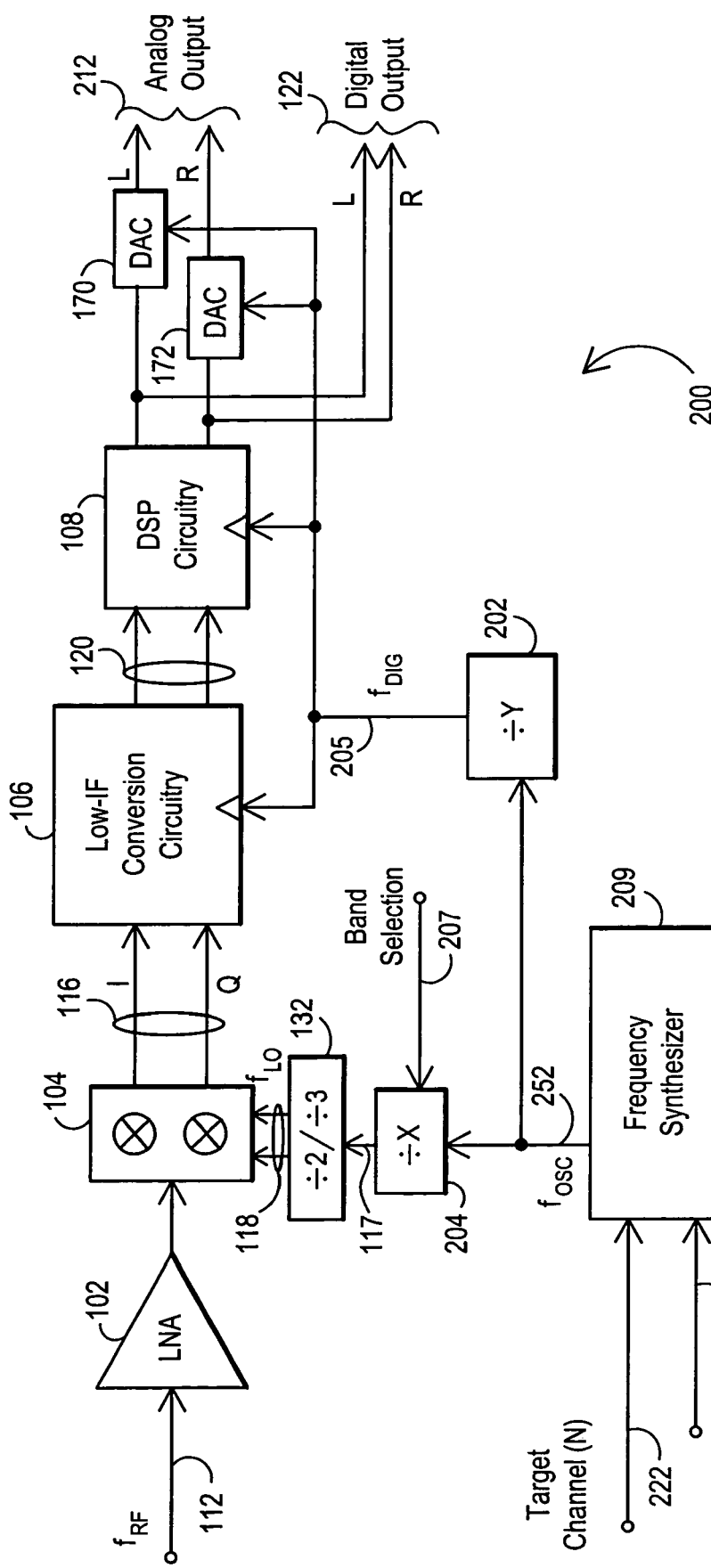
FIG. 2A is a block diagram of an embodiment for an integrated terrestrial broadcast receiver that utilizes a phase lock loop (PLL) and a ratiometric clock to provide mixing signals and digital clock signal for the receiver circuitry.

FIG. 2A is a block diagram for an embodiment 200 of an integrated terrestrial broadcast receiver that utilizes a frequency synthesizer 209 and ratiometric clock signals to provide LO mixing signals ($f_{LO}$) 118 and a digital clock signal ($f_{DIG}$) 205 for the receiver circuitry. As with FIG. 1A, an RF input signal spectrum ($f_{RF}$) 112 is received by a low noise amplifier (LNA) 102 and processed by mixer 104 to generate real (I) and imaginary (Q) signals 116. Low-IF conversion circuitry 106 and DSP circuitry 108 processes these signals to produce left (L) and right (R) digital audio output signals 122. In addition, as shown in FIG. 1B, these left (L) and right (R) digital audio output signals 122 can be processed with additional circuitry, as represented by digital-to-analog conversion (DAC) circuits 170 and 172, to produce left (L) and right (R) analog output signals 212.

As further depicted in embodiment 200 of FIG. 2A, a phase shift block 132 can be utilized, and this phase shift block 132 can be a divide-by-two block that produces two mixing signals 118 that are 90 degrees out of phase with each other. The use of two mixing signals 90 degrees out of phase is the typical technique for generating mixing signals for mixers, such as mixer 104, to produce real (I) and imaginary (Q) signals, such as signals 116. If desired, phase shift block 132 may also be a divide-by-three block that produces two mixing signals that are 120 degrees out of phase with each other. Depending upon the implementation of the phase shift block 132, the processing provided by the low-IF conversion circuitry 106 and the DSP circuitry 108 will change accordingly. It is also noted that more generally block 132 represents quadrature generation circuitry that can be implemented in a number of different ways to achieve mixing signals 118 for the mixer 104. In addition, if desired, the function of block 132 could be included within other blocks represented in FIG. 2A and FIGS. 3A-3B.

In the embodiment 200 depicted, the LO generation circuitry includes a frequency synthesizer 209, a divide-by-X block (÷X) 204, and quadrature generation circuitry or phase shift block 132. Phase shift block 132 provides phase shifted LO mixing signals 118 to mixer 104. The frequency synthesizer 209 generates an output signal ($f_{OSC}$) 252 that is at a desired frequency. The frequency synthesizer 209 can be implemented in a variety of ways, including the use of a phase locked loop (PLL), a frequency locked loop (FLL) or some other desired oscillation generation circuitry. The frequency of the output signal ($f_{OSC}$) 252 is determined by control circuitry that utilizes a target channel input signal (TARGET CHANNEL) 222 to select the desired output frequency. As discussed further below, the frequency of this target channel signal 222 can be correlated to an integer (N) that is selected based upon the desired channel. The frequency synthesizer 209 also utilizes an input reference frequency ($f_{REF}$) 206 in generating an output signal ($f_{OSC}$) 252 at the desired frequency. The output signal ($f_{OSC}$) 252 is then passed through the divide-by-X block (÷X) 204 to generate an output signal 117 that is used to generate the desired LO mixing signals ($f_{LO}$) 118 for the mixer 104. If desired, and as discussed in more detail below, a band selection signal (BAND SELECTION) 207 can be utilized and can be applied to divide-by-X block (÷X) 204. This band selection signal 207 can be utilized to adjust the tuning band for the receiver 200. For example, the tuning band could be adjusted from the FM broadcast band to the AM broadcast band. In this way, a single receiver can be used to tune channels within multiple broadcast bands.

Advantageously, the output signal ($f_{OSC}$) 252 can also be used to produce the digital clock signal ($f_{DIG}$) 205 utilized by digital circuitry within the low-IF conversion circuitry 106, the DSP circuitry 108, and the DACs 170 and 172. In this way, the digital clock signal ($f_{DIG}$) 205, other clock signals based upon the digital clock signal ($f_{DIG}$) 205, the LO mixing signals 118, the output signal ($f_{OSC}$) 252, and intervening clock nodes are all at frequencies that are divisors or multiples of each other or of a common base clock signal thereby making the clock signals ratiometric. To produce the digital clock signal ($f_{DIG}$) 205, the output signal ($f_{OSC}$) 252 is passed through a divide-by-Y block (÷Y) 202. By using the output signal ($f_{OSC}$) 252 to generate both the LO mixing signals 118 for the mixer 104 and the digital clock signal ($f_{DIG}$) 205, these two resulting signals become ratiometric, thereby tending to limit potential interference between the two signals because digital harmonics of these signals will tend to fall on the frequency of the oscillation signal ($f_{OSC}$) 252. Previous systems typically used an external reference clock to drive a digital clock signal on a separate integrated circuit from the mixing circuitry. If such systems then attempted to integrate the mixer and digital circuitry into the same integrated circuit, performance-degrading interference would typically be generated. In contrast, the ratiometric clock feature of the present invention reduces undesirable interference and allows for improved performance of an integrated receiver.

Figure 2B:
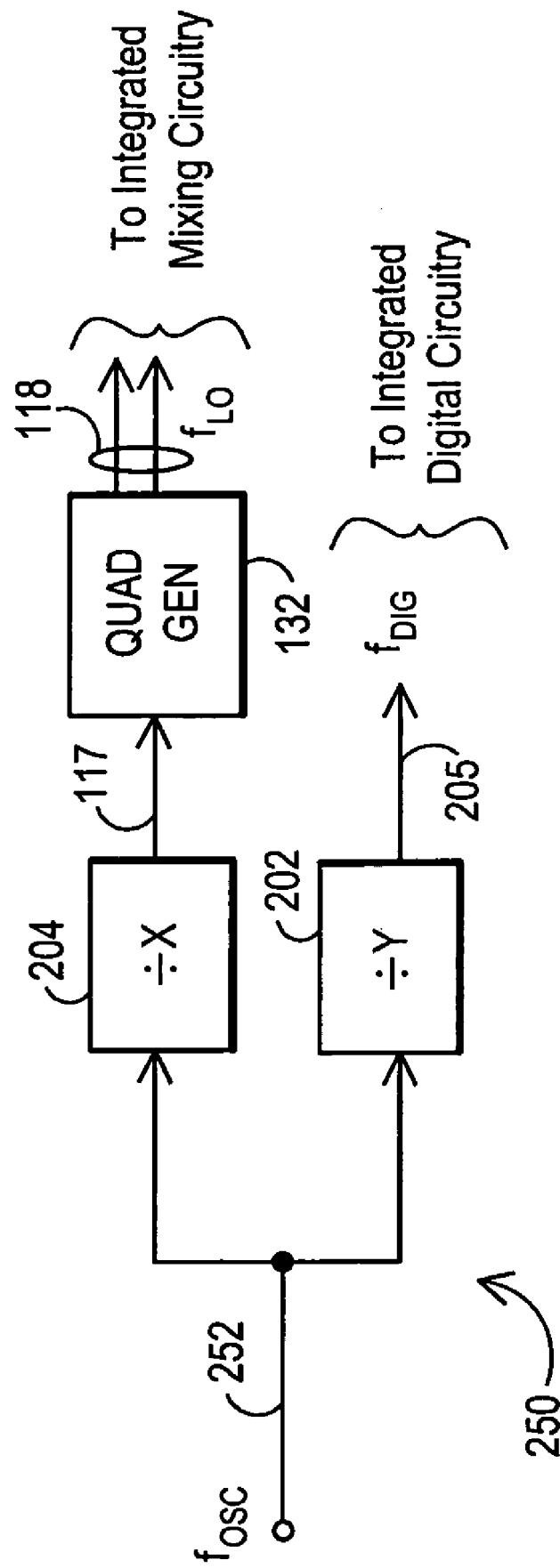
FIG. 2B is a block diagram for a ratiometric clock system.
Figure 3A:
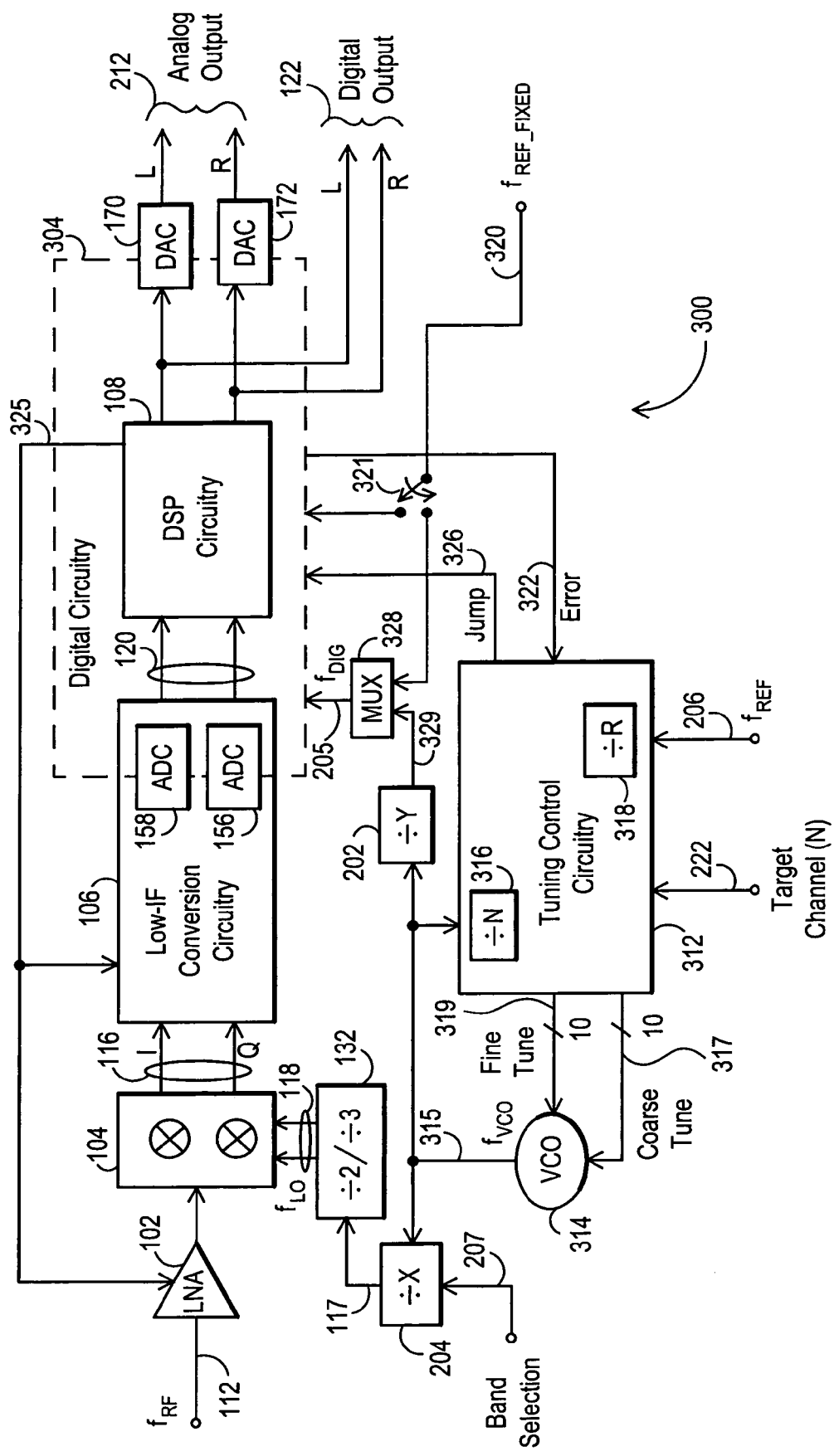
FIG. 3A is a block diagram of an alternative embodiment for an integrated terrestrial broadcast receiver that utilizes tuning control circuitry and a ratiometric clock to provide mixing signals and digital clock signal for the receiver circuitry.

FIG. 2B is a block diagram for the basic structure of a ratiometric clock system 250 and sets forth the basic elements for the ratiometric clock of the present invention. An input oscillation signal ($f_{OSC}$) 252 is received by system 250. This oscillation signal ($f_{OSC}$) 252 can be generated using a wide variety of different circuits. For example, a PLL could be utilized to provide the oscillation signal ($f_{OSC}$) 252 that is used to generate LO mixing signals 118 and the digital clock signal ($f_{DIG}$) 205. In FIG. 3A, which is discussed below, a voltage controlled oscillator (VCO) 314 is used to generate an oscillation signal ($f_{VCO}$) 315 that is used to generate LO mixing signals 118 and the digital clock signal ($f_{DIG}$) 205. The VCO 314 can be controlled as part of a PLL, for example, or through a frequency locked loop control algorithm implemented within the tuning control circuitry 312. In short, the ratiometric clock of the present invention can be utilized with a wide range of circuits that can produce the starting oscillation signal from which a plurality of other ratiometric clock signals are generated.

Looking back to the example of FIG. 2B, it is seen that a first and second divider circuits are used to generate two ratiometric clock signals. In particular, as depicted, divide-by-X block (÷X) 204 receives the input oscillation signal ($f_{OSC}$) 252 and outputs signal 117. This output signal 117 is processed by quadrature generation (QUAD GEN) circuitry 132 to generate the two LO mixing signals ($f_{LO}$) 118 that can be used by mixer 104. Divide-by-Y block (÷Y) 202 receives the input oscillation signal ($f_{OSC}$) 252 and outputs a digital clock signal ($f_{DIG}$) 205 that can be used to generate digital clock signals used by integrated digital circuitry, such as digital circuitry within the low-IF conversion circuitry 106 and DSP circuitry 108. It is noted that other ratiometric clock signals could be generated if desired and that the ratiometric clocks generated could be utilized for other purposes if desired. And it is noted that the mixer circuitry and the digital circuitry that use these ratiometric clock signals, along with the ratiometric clock system 250, would preferably be integrated into the same integrated circuit.

In operation, as stated above, the ratiometric clock feature of the present invention helps to reduce undesired interference because the mixing signals and the digital clock signals are divisors or multiples of each other or of a common base clock signal. Along with the integer N related to the target channel signal 222, the divide values X and Y provide programmable control of the clock signals being utilized. For example, the following equations can be used to represent the circuitry presented in FIG. 3A, which is discussed in more detail below, and the ratiometric values for the oscillation output signal ($f_{OSC}$) 252, the digital clock signal ($f_{DIG}$) 205, and the LO mixing signals ($f_{LO}$) 118 (assuming a divide-by-two quadrature generator is utilized), which are all based upon the reference frequency ($f_{REF}$) 206.

$$f_{VCO} = (f_{REF}/R) \cdot N$$

$$f_{signal\ 117} = f_{VCO}/X = (f_{REF} \cdot N)/(R \cdot X)$$

$$f_{LO} = f_{signal\ 117}/2 = (f_{REF} \cdot N)/(2 \cdot R \cdot X)$$

$$f_{DIG} = f_{VCO}/Y = (f_{REF} \cdot N)/(R \cdot Y)$$

$$f_{VCO} = f_{LO} \cdot (2 \cdot X) = f_{DIG} \cdot Y$$

The values of N, R, X and Y can then be selected and controlled to achieve the desired frequencies for these signals. And the selection criteria for the values of N, R, X and Y can be implemented as desired. For example, these values can be selected according to an on-chip look-up table or could be set through a user-configurable register. As shown in FIG. 3A, an error signal (ERROR) 322 may also be generated, for example, using the DSP circuitry 108, that identifies errors in tuning the received signal. This error signal can then be used to modify the N value in order to reduce frequency error essentially to zero when tuning a received signal.

As an example for an FM spectrum, the reference frequency ($f_{REF}$) 206 can be selected to be 32.768 kHz. The low-IF target frequency can be selected to be about 200 KHz. X can be selected to be 12. Y can be selected to be 100. N and R can be selected to vary depending upon the FM channel to be tuned. For example, for a desired FM channel to be tuned that is centered at about 100 MHz, N can be selected to be 73096 with R considered nominally to be equal to 1. With these numbers selected, the oscillation signal ($f_{OSC}$) 252 would be 2.395 GHz. The digital clock signal ($f_{DIG}$) 205 would be 23.95 MHz. The output signal 117 would be 199.6 MHz. And the LO mixing signals ($f_{Lo}$) 118 to mixer 104 would be 99.8 MHz. The mixer 104 would then mix the input signal spectrum 112 ($f_{RF}$) with the mixing signals 118 from phase block 132 to mix the desired FM channel at 100 MHz to a low-IF target frequency of about 200 kHz (i.e., 100.0 MHz-99.8 MHz component ends up at about 200 kHz). The appropriate N value for each channel with the FM broadcast spectrum could then be similarly selected such that the mixer 104 mixes the desired channel down to the target IF frequency. It is noted that the values for X and Y could also be modified, if desired. And it is noted that the target IF frequency could be a variable frequency, for example, if discrete tuning steps were used for the LO generation circuitry.

In addition, as indicated above, the divide-by-X block (÷X) can also receive the band selection signal (BAND SELECTION) 207. This signal can be used to select the frequency band within which the receiver is tuning channels. For example, the oscillation output signal ($f_{OSC}$) 252 can be a signal at about 2-3 GHz or greater, and the band selection signal (BAND SELECTION) 207 can be used to select what values are used for X, thereby determining the tuning range for the receiver. This technique is useful because many oscillators have a good operating range from minimum to maximum frequency that differ by a factor of about 1.3. Thus, the FM spectrum from 88.1 to 107.9 can be tuned using a single on-chip oscillator because this correlates to oscillation output signal ($f_{OSC}$) 252 of about 2.114 GHz to 2.590 GHz, assuming the value of 12 for X, and this range is within a factor of 1.3 from minimum to maximum frequencies. However, if additional broadcast spectrums were desired to be tuned, this single on-chip oscillator would have to operate outside of its good operating range, unless other factors were modified. With the architecture described above, the values for X (and N) can be adjusted to move the resulting tuning range into the desired frequency band while still using the same on-chip oscillator.

FIG. 3A is a block diagram of an alternative embodiment 300 for an integrated terrestrial broadcast receiver that utilizes tuning control circuitry 312 and a ratiometric clock system to provide an LO mixing signals ($f_{LO}$) 118 and a digital clock signal ($f_{DIG}$) 205 for the receiver circuitry. As with FIGS. 1 and 2A, an RF input signal spectrum ($f_{RF}$) 112 is received by a low noise amplifier (LNA) 102 and processed by mixer 104 to generate real (I) and an imaginary (Q) signals 116. Low-IF conversion circuitry 106 and DSP circuitry 108 process these signals to produce left (L) and right (R) digital audio output signals 122. In addition, as shown in FIG. 2A, these left (L) and right (R) digital audio output signals 122 can be processed with additional circuitry, as represented by digital-to-analog conversion (DAC) circuits 170 and 172, to produce left (L) and right (R) analog output signals 212. Also, as in FIG. 2A, the LO input signal ($f_{LO}$) 118 and the digital clock signal ($f_{DIG}$) 205 can be generated as ratiometric clock signals using divide-by-X block (÷X) 204 and divide-by-Y block (÷Y) 202. And a band selection signal (BAND SELECTION) 207 can also be applied to divide-by-X block (÷X) 204, if desired. In addition, a quadrature generator or phase shift block 132 provides phase shifted mixing signals 118 to mixer 104.

As depicted in more detail in FIG. 3A, dotted line 304 represents the digital circuitry within a single integrated circuit, such as digital circuitry within the low-IF conversion circuitry 106, DSP circuitry 108 and the DACs 170 and 172. In particular, analog-to-digital converter (ADC) 156 and ADC 158 represent the analog-to-digital conversion circuitry that produces the real (I) and imaginary (Q) digital signals 120. ADC 156 and ADC 158 utilize a sampling clock signal based upon the digital clock signal ($f_{DIG}$) 205. Similarly, the circuitry within the DSP circuitry 108 utilizes clock signals based upon the digital clock signal ($f_{DIG}$) 205. In contrast with the embodiment 200 of FIG. 2A, in the embodiment 300 of FIG. 3A, it is shown that the digital clock signal ($f_{DIG}$) 205 can be selected through a multiplexer (MUX) 328 to be a ratiometric clock signal 329 or an external reference clock signal ($f_{REF\_FIXED}$) 320. Although it is desirable for the ratiometric clock signal 329 to be utilized in order to reduce performance degrading interference, an external reference clock signal, such as clock signal ($f_{REF\_FIXED}$) 320 could be used, if desired. In addition, if desired, rather than being selected through MUX 328, the clock signal ($f_{REF\_FIXED}$) 320 could be used as a separate clock source in addition to the digital clock signal ($f_{DIG}$) 205 for digital circuitry 304. For example, a switch 321 could be used to supply the clock signal ($f_{REF\_FIXED}$) 320 directly to the digital circuitry 304 so that both the clock signal ($f_{REF\_FIXED}$) 320 and the ratiometric clock signal 329 could be utilized by the digital circuitry 304. Such an embodiment is also described in more detail with respect to FIG. 3B below. It is further noted that the digital clock signal ($f_{DIG}$) 205 from the MUX 328 and the reference clock signal ($f_{REF\_FIXED}$) 320 could be passed through additional dividers, multipliers or other clock generation circuits before being utilized as clock signals for the digital circuitry 304 within the low-IF conversion circuitry 106 and the DSP circuitry 108. And one or more different clock signals could be generated for use with the different circuit blocks within the digital circuitry 304.

The tuning control circuitry 312 of FIG. 3A controls a voltage controlled oscillator (VCO) 314, which in turn generates an oscillation signal ($f_{VCO}$) 315 that is used to generate the ratiometric clock signals. The tuning control circuitry 312 receives a target channel signal (TARGET CHANNEL) 222, which represents the desired channel to be tuned, receives the oscillation signal 315 from the VCO 314 as a feedback signal, and receives a reference frequency signal ($f_{REF}$) 206. As discussed above, the target channel signal 222 can be correlated to an integer (N) that is selected based upon the desired channel. Divider blocks, represented by divide-by-N block (÷N) 316 and divide-by-R block (÷R) 318, have values that are selected based upon the target channel signal (TARGET CHANNEL) 222 to control the coarse and fine tune signals 317 and 319. More particularly, the value for N corresponds to the desired target channel, assuming R has a nominal value of 1. In the embodiment depicted, the fine tune signal (FINE TUNE) 319 and the coarse tune signal (COARSE TUNE) 317 are 10-bit control signals. It is noted that the coarse and fine tune signals 317 and 319 can be signals of any desired bit size, can be of different sizes, and can be variable or analog signals, if desired. Other control signals could also be utilized, as desired, depending upon the VCO circuitry utilized for VCO 314. It is further noted that the VCO circuitry represented by block 314 can be implemented using a number of different oscillator circuits. Example oscillator circuitry that can be utilized is described in U.S. Pat. No. 6,388,536, which is entitled "METHOD AND APPARATUS FOR PROVIDING COARSE AND FINE TUNING CONTROL FOR SYNTHESIZING HIGH-FREQUENCY SIGNALS FOR WIRE- LESS COMMUNICATIONS" and which is hereby incorporated by reference in its entirety.

It is also noted that the VCO 314 may preferably have an output frequency equal to or above about 2.3 GHz in order to reduce interference with other services, such as cell phone operational frequencies. This relatively high output frequency also facilitates an efficient, small integrated circuit where LC tank oscillation circuits are utilized because the LC tank elements can be made relatively small. In particular, with output frequencies for the VCO 314 in this range of being equal to or above about 2.3 GHz, the one or more inductors that would be needed for an LC tank implementation of the VCO 314 can be integrated into the integrated circuit or included with the device package.

In operation, the tuning control circuitry 312 first receives the target channel signal (TARGET CHANNEL) 222 indicating the channel to be tuned within the frequency spectrum of the input signal spectrum ($f_{RF}$) 112. The tuning control circuitry 312 places the fine tune signal (FINE TUNE) 319 at a nominal or initial setting, and tuning control circuitry 312 then outputs a coarse tune signal (COARSE TUNE) 317 to provide coarse tuning of the VCO 314. The tuning control circuitry 312 then adjusts the fine tune signal (FINE TUNE) 319 to fine tune and lock the VCO 314 to the desired oscillation output signal 315. A feedback signal from oscillation signal 315 is then used to control the tuning of the output from the VCO 314. In addition, an error signal (ERROR) 322 can also be utilized to help accomplish this tuning. The error signal (ERROR) 322 can represent tuning errors in the received signal, and the tuning control circuitry 312 can use this error signal to automatically adjust the output frequency of the VCO 314 to correct for these tuning errors. Thus, both the feedback signal from the output signal 315 of the VCO 314 and an additional error signal (ERROR) 322 can be utilized by the tuning control circuitry 312 for frequency control.

When the oscillation signal 315 is changed in order to tune a particular desired channel, the digital clock signal ($f_{DIG}$) 205 will also change in a ratiometric fashion depending upon the selection of the values for X and Y in blocks 204 and 202, respectively. Similarly, this change in the digital clock signal ($f_{DIG}$) 205 also happens with changes to the output signal ($f_{OSC}$) 252 of FIG. 2A. Because of this change in the digital clock signal ($f_{DIG}$) 205, as shown in FIG. 3A, an LO jump signal (JUMP) 326 can be output by the tuning control circuitry 312 to indicate that a change in the oscillation signal 315 has occurred. Using this LO jump signal (JUMP) 326, the digital circuitry 304 can utilize compensation routines, if desired, to adjust operation for the ratiometric change in the digital clock signal ($f_{DIG}$) 205.

As described above, the X and Y divider blocks in FIGS. 2A, 2B, 3A and 3B can be changed by program or algorithm control, as desired, to achieve the oscillation frequencies and the ratiometric ratios desired. For example, it is desirable that a change in the oscillation signals 252 and 315 of FIGS. 2A, 3A and 3B correlate to less than a 1% change in the value of the digital clock signal ($f_{DIG}$) 205. The values for X and Y in blocks 204 and 202, therefore, can be selected accordingly. It is noted that an integrated on-chip microcontroller can be utilized to provide control of the dividers and other receiver operation parameters, if desired. And this microcontroller can also be used to implement some or all of the digital processing done by the DSP circuitry 108.

For additional control, as indicated above, the tuning control circuitry 312 can receive an error signal (ERROR) 322 from the digital circuitry 304. This error signal (ERROR) 322 from the digital circuitry 304 represents an error signal correlating to noise or interference detected in the receive path due to errors in the tuning of the input signal spectrum ($f_{RF}$) 112 to the proper channel. The tuning control circuitry 312 can utilize this error signal (ERROR) 322 to adjust the N value within block 316 so as to more finally tune the received signal. Also, additional control signals, as represented by element 325, can be provided from the DSP circuitry 108 to the LNA 102, the low-IF conversion circuitry 106, or other receiver circuitry to provide control for those circuits.

Figure 3B:
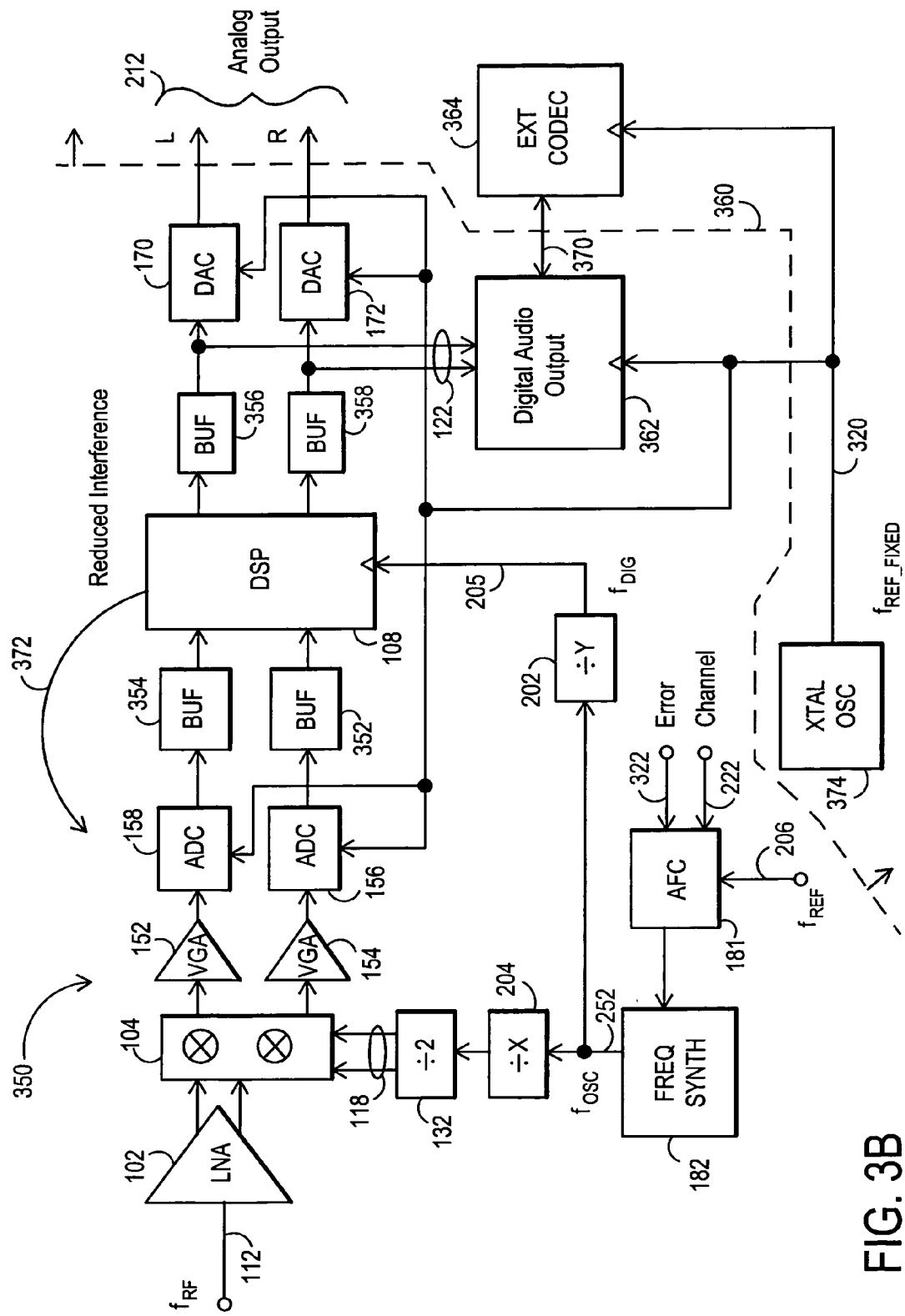
FIG. 3B is a block diagram of an alternative embodiment for an integrated terrestrial broadcast receiver that utilizes a ratiometric digital clock and an external reference clock for digital circuitry.

FIG. 3B is a block diagram of an additional alternative embodiment 350 for an integrated terrestrial broadcast receiver that utilizes a ratiometric digital clock ($f_{DIG}$) 205 and an fixed external reference clock ($f_{REF\_FIXED}$) 320 for digital circuitry within the integrated receiver. An RF input signal spectrum ($f_{RF}$) 112 is received by a low noise amplifier (LNA) 102 and processed by mixer 104 to generate real (I) and an imaginary (Q) signals. The signals are then processed with VGAs 152 and 154 and ADCs 158 and 156 to produce digital signals. These digital signals are then provided to an I-path buffer (BUF) 354 and a Q-path buffer (BUF) 352 before being processed by the DSP 108 to generate digital left and right audio signals. The outputs of the DSP 108 are then provided to a left audio signal buffer (BUF) 356 and a right audio signal buffer (BUF) 358. The outputs of these buffers 356 and 358 can provide the left (L) and right (R) digital audio signals 122. The outputs of these buffers 356 and 358 can also be provided to DACs 170 and 172 to produce left (L) and right (R) analog audio signals 212. The clock signals utilized in this embodiment 350 are described in more detail below.

As with earlier embodiments, the LO input signal ($f_{LO}$) 118 and the digital clock signal ($f_{DIG}$) 205 can be generated as ratiometric clock signals using divide-by-X block (÷X) 204 and divide-by-Y block (÷Y) 202. The output of the divide-by-X block (÷X) 204 passes through divide-by-two (÷2) 132 to provide the two out-of-phase LO mixing signals 118. A frequency synthesizer 182 generates the oscillation signal ($f_{OSC}$) 252 and is controlled by the automatic frequency control (AFC) block 181. The AFC block 181 receives an external reference signal ($f_{REF}$) 206, a channel selection (CHANNEL) signal 222, and a tuning correction error (ERROR) signal 322. These signals are discussed above with respect to FIG. 3A. In addition, it is noted that the external reference signal ($f_{REF}$) 206 can be the same signal as the fixed external reference clock ($f_{REF\_FIXED}$) 320 or can be generated from the fixed external reference clock ($f_{REF\_FIXED}$) 320, if this clock configuration is desired.

The clock signals for the digital circuitry within embodiment 350 are provided using the digital clock signal ($f_{DIG}$) 205 and the fixed external reference clock ($f_{REF\_FIXED}$) 320. The fixed external reference clock ($f_{REF\_FIXED}$) 320 can be generated, if desired, by a crystal oscillator (XTAL OSC) 374 operating, for example, at 12.288 MHz. The DSP circuitry 108 can be clocked using the digital clock signal ($f_{DIG}$) 205, which is ratiometric with respect to the oscillation signal ($f_{OSC}$) 252, as discussed above. Again, by using a ratiometric clock signal to clock the DSP circuitry 108, interference (as represented by arrow 372) with the mixing circuitry 104 and other analog circuitry on the integrated circuit is reduced. Rather than be clocked using the digital clock signal ($f_{DIG}$) 205, the digital audio output circuitry 362 and the external CODEC 364 are clocked using the fixed external reference clock ($f_{REF\_FIXED}$) 320. The ADCs and DACs 156, 158, 170 and 172 in this embodiment are also clocked using the fixed external reference clock ($f_{REF\_FIXED}$) 320. Because the DSP 108 and the ADCs and DACs 156, 158, 170 and 172 are operating at different clock frequencies, the buffers 352, 354, 356 and 358 can be used to buffer the data between the different data rates. These buffers 352, 354, 356 and 358 can be, for example, dual port buffer memories that have the ability to input data at one desired clock rate and output data at another desired clock rate.

This clocking architecture can provide advantages for receiver applications where integrated circuits need to communicate at a specified rate. Audio standards, for example, can require communications to provide audio data at a particular rate, such as 48,000 samples per second (48 ks/s). In the embodiment of FIG. 3B, the digital audio output circuitry 362 would communicate the left (L) and right (R) digital audio signals 122 to the external CODEC 364 at the specified rate through an external interface 370. So that the sample rates correlate to the specified communication rates, the ADCs and DACs 156, 158, 170 and 172 can also be clocked using the fixed external reference clock ($f_{REF\_FIXED}$) 320. Although some interference may be generated using these non-ratiometric clock signals, the advantages of correlated sample rates make this architecture advantageous. It is noted that dotted line 360 represents the boundary of the integrated circuit.

Figure 4A:
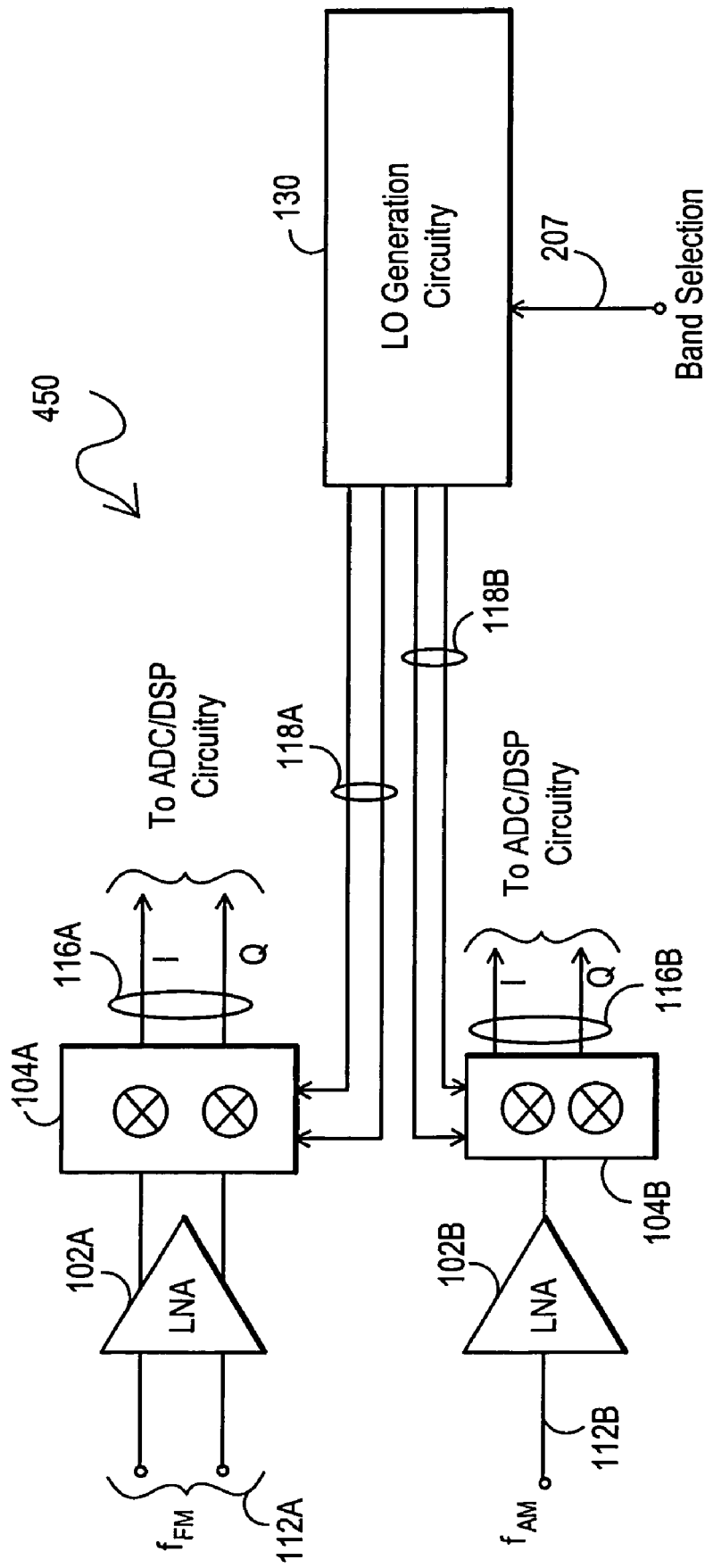
FIG. 4A is a block diagram of an embodiment for an integrated terrestrial broadcast receiver that includes both AM broadcast reception and FM broadcast reception.

FIG. 4A is a block diagram of an embodiment 450 for an integrated terrestrial broadcast receiver that includes both AM broadcast reception and FM broadcast reception. In the embodiment depicted, input FM broadcast signals 112A are sent as differential signals to LNA 102A. The differential output of LNA 102A is sent to mixer 104A, which uses LO mixing signals 118A from LO generation circuitry 130 to produce I and Q signals 116A. These quadrature FM signals can then processed by the ADC and DSP circuitry integrated within the same integrated circuit. Input AM broadcast signals 112B are sent to LNA 102B and then to mixer 104B. Mixer 104B uses LO mixing signals 118B from LO generation circuitry 130 to produce I and Q signals 116B. These quadrature AM signals can then processed by the ADC and DSP circuitry integrated within the same integrated circuit. In operation, the LO generation circuitry 130 can receive a band selection (BAND SELECTION) signal 207 that allows a selection of which broadcast band is to be processed by the receiver. It is also noted that the LO generation circuitry 130, if desired, can generate a single set of mixing signals that can be used by both the FM mixer 104A and the AM mixer 104B, depending upon the selection made by the band selection signal 207.

Figure 4B:
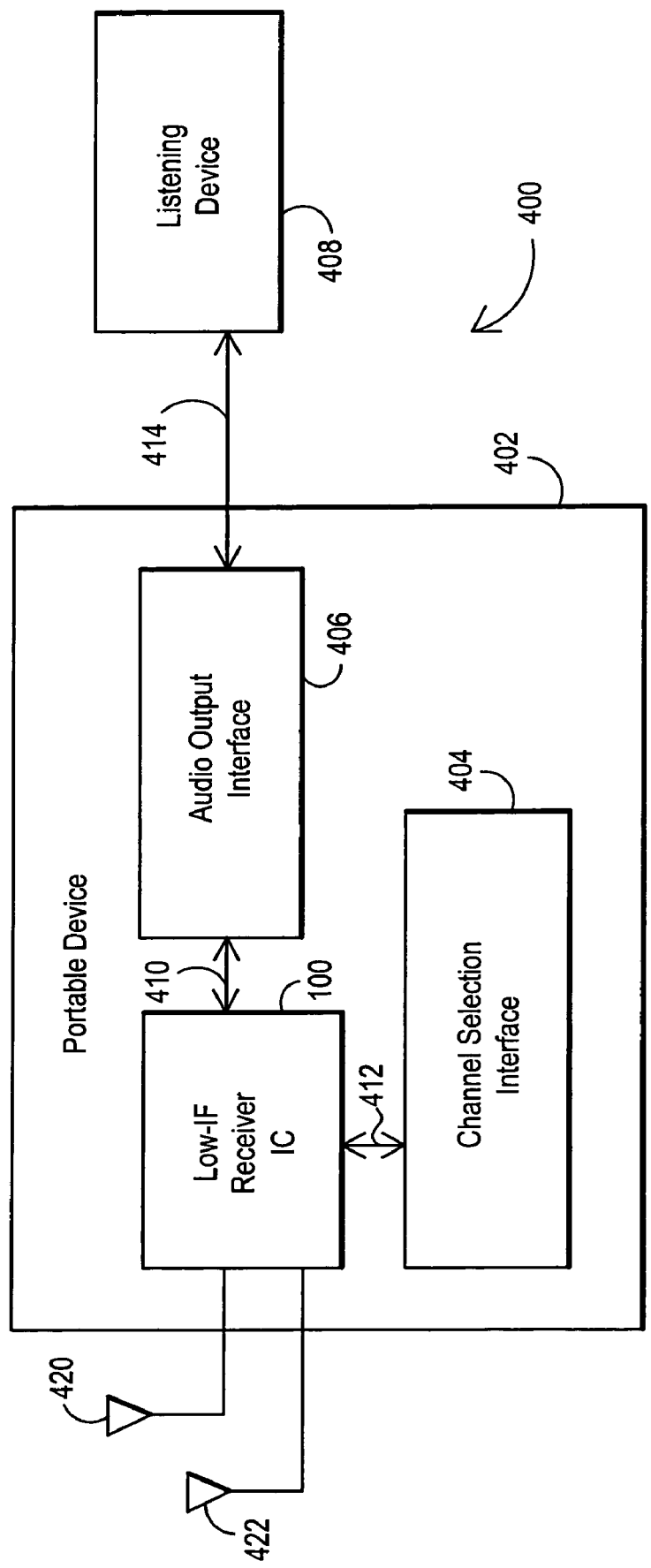
FIG. 4B is a block diagram of an embodiment for a portable device that takes advantage of the integrated terrestrial broadcast receiver, according to the present invention.

FIG. 4B is a block diagram of an embodiment 400 for a portable device 402 that utilizes a low-IF integrated terrestrial broadcast receiver 100 according to the present invention. As depicted, the portable device includes a low-IF receiver integrated circuit 100 coupled to a channel selection interface circuitry 404 through connections 412 and to an audio output interface circuitry 406 through connections 410. The audio output interface circuitry 406 is in turn coupled to listening device 408 through connections 414. In such a portable environment, the listening device 408 is often headphones that can be easily plugged into the portable device 402. The embodiment 400 can also include one or more antennas, such as an FM broadcast antenna 420 and an AM broadcast antenna 422. It is noted that a portable device as contemplated in this embodiment is preferably a small portable device in that it has a volume of about 70 cubic inches or less and has a weight of about 2 pounds or less. For example, as indicated above, the small, portable device 402 could be a cellular phone, an MP3 player, a PC card for a portable computer, a USB connected device or any other small portable device having an integrated terrestrial audio broadcast receiver. It is also noted that the audio output interface 406 can provide digital audio output signals, analog audio output signals, or both. And the interface circuitry 406 and 408 could be combined, if desired, such as would be the case if a single serial or parallel interface were used to provide the communication interface for the portable device 402.

Figure 5A:
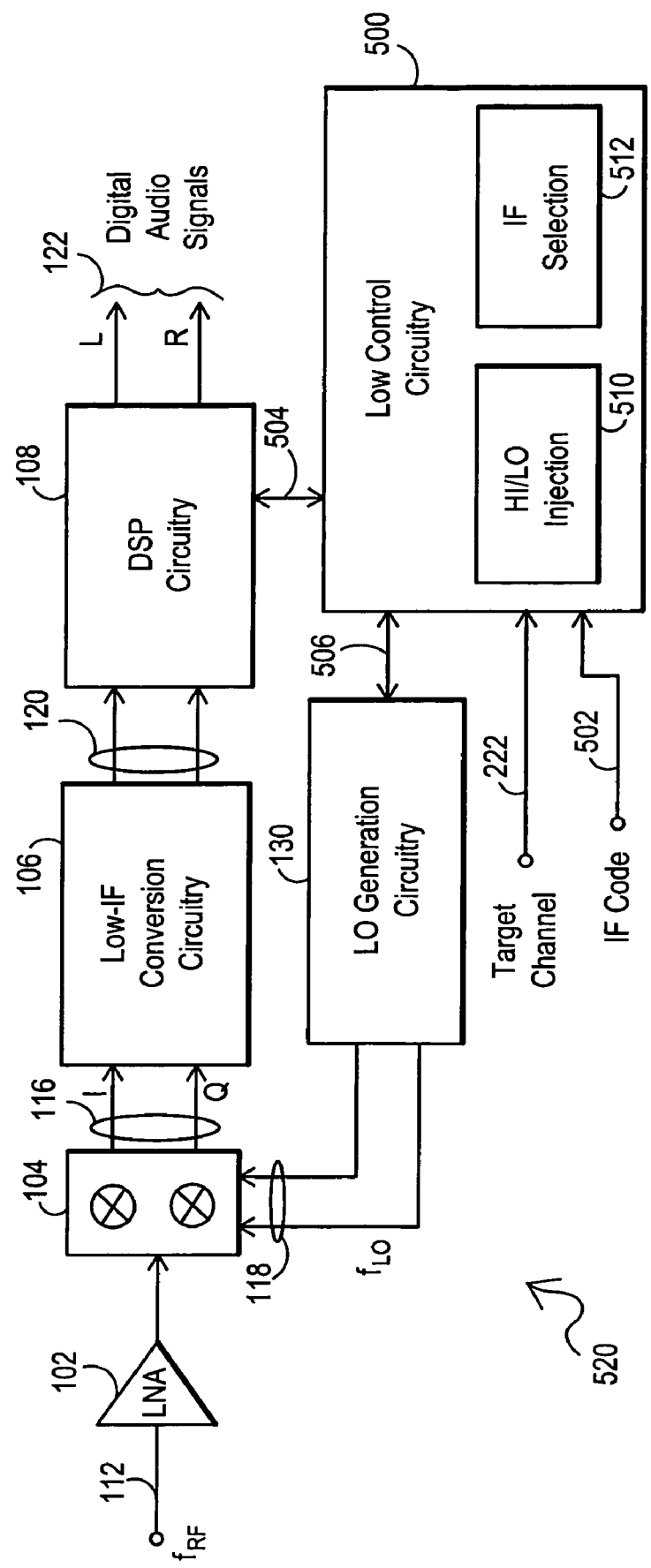
FIG. 5A is a block diagram for an embodiment of an integrated terrestrial broadcast receiver that includes local oscillator (LO) control circuitry for adding certain frequency control features.

FIG. 5A is a block diagram for an embodiment 520 of an integrated terrestrial broadcast receiver that includes local oscillator (LO) control circuitry 500 for adding certain frequency control features. As with the embodiment 100 in FIG. 1A, an RF input signal spectrum ($f_{RF}$) 112 is received by a low noise amplifier (LNA) 102 and processed by mixer 104 to generate real (I) and an imaginary (Q) signals 116. Low-IF conversion circuitry 106 and DSP circuitry 108 processes these signals to produce left (L) and right (R) digital audio output signals 122. As discussed above with respect to FIG. 1A, it is again noted that other or different output signals could be provided by the receiver, if desired. In addition, the LO mixing signals ($f_{LO}$) 118 are generated by LO generation circuitry 130, and these phase shifted mixing signals 118 are used by mixer 104, as discussed above.

LO control circuitry 500 is added in FIG. 5A to implement additional frequency control features. One such feature is a high-side versus low-side LO signal injection selection feature as represented by block (HI/LO INJECTION) 510. Another feature is a programmable IF location selection feature as represented by block (IF SELECTION) 512. These frequency control features are discussed in more detail with respect to FIGS. 5B and 5C. The LO control circuitry 500 is coupled to the DSP circuitry 108 through one or more signals 504 and to the LO generation circuitry 130 through one or more signals 506.

Figure 5B:
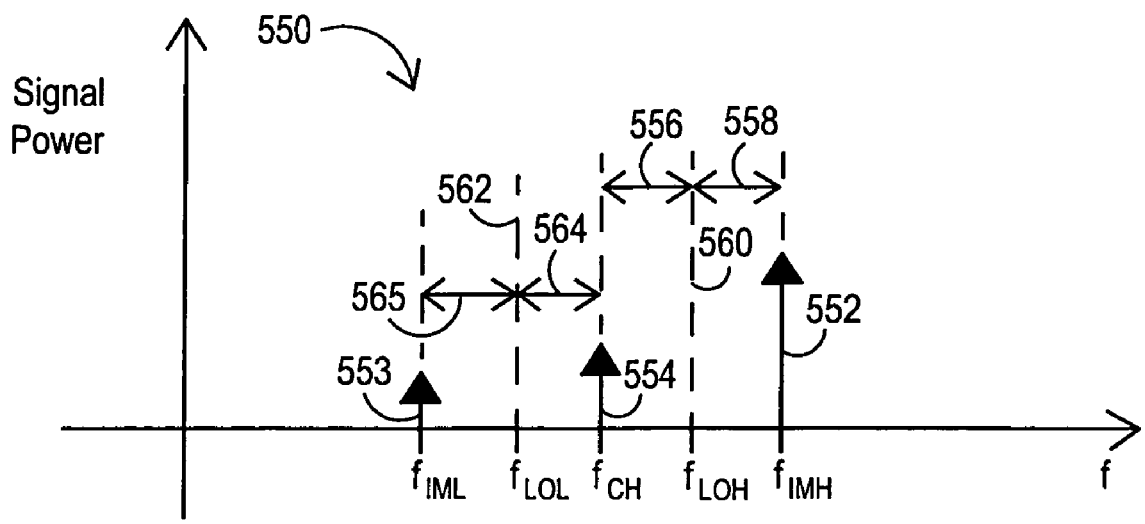
FIG. 5B is a signal diagram for one frequency control feature provided by the embodiment of FIG. 5A, namely high-side versus low-side local oscillator (LO) signal injection.

FIG. 5B is a signal diagram for a high-side versus low-side LO signal injection selection feature. In the example 550, a desired channel ($f_{CH}$) to be tuned is represented by signal arrow 554. A larger interference signal ($f_{IMH}$) is represented by signal arrow 552. As is well known, mixer 104 will mix the input RF signal spectrum ($f_{RF}$) 112 to the intermediate frequency ($f_{IF}$) in accordance with the equation $f_{RF} - f_{LO} = f_{IF}$ if low-side injection is utilized and in accordance with the equation $f_{IF} = f_{LO} - f_{RF}$ if high-side injection is utilized. The designations $f_{LOL}$ and $f_{LOH}$ represent these two possible LO signals for the low-side injection signal ($f_{LOL}$) 562 and high-side injection signal ($f_{LOH}$) 560, respectively. Many systems operate by implementing either high-side injection or low-side injection and do not provide the ability to switch between the two during operation. Some systems have attempted to select between high-side and low-side injection during operation by assessing the level of noise or spurs in the tuned target channel signal after it has been processed through the receive path circuitry.

With the LO control circuitry 500 of the present invention, however, dynamic selection of high-side or low-side injection is implemented by making an assessment of image signal power within the spectrum before the selection of high-side or low-side injection is made and before the desired channel itself has been processed and tuned. This selection can be made, for example, using a selection algorithm that is configured to determine whether high-side injection or low-side injection is preferable based upon the image power at frequencies that are equal in distance from the LO frequencies as the desired channel. By tuning to these frequencies and through signals 504 from the DSP circuitry 108, for example, the LO control circuitry can assess the signal power at frequencies that could create significant performance-degrading images. In particular, the next adjacent upper image signal power and the next adjacent lower image signal power can be assessed to determine whether or not to use high-side or low-side injection. And this assessment can be made at power-up across the entire spectrum, periodically across the entire spectrum, across a reduced spectrum that includes the desired channel to be tuned, each time a channel is tuned, or at any other desired time across any desired portion of the spectrum depending upon the algorithm implemented.

Looking back to FIG. 5B, interference signal ($f_{IMH}$) 552 represents an upper image signal that is as far from the high-side LO injection signal ($f_{LOH}$) 560 as is the desired channel ($f_{CH}$) 554. If high-side injection were utilized, the mixer would use the high-side injection LO signal ($f_{LOH}$) 560, and the interference signal ($f_{IMH}$) 552 would be mixed onto the intermediate frequency ($f_{IF}$) along with the desired channel ($f_{CH}$) 554. Thus, the use of high-side injection would create a large undesirable image. Similarly, the interference signal ($f_{IML}$) 553 represents a lower image signal that is as far from the low-side LO injection signal ($f_{LOL}$) 562 as is the desired channel ($f_{CH}$) 554. If low-side injection were utilized, the mixer would use the low-side injection LO signal ($f_{LOL}$) 562, and the interference signal ($f_{IML}$) 553 would be mixed onto the intermediate frequency ($f_{IF}$) along with the desired channel ($f_{CH}$) 554. Thus, the use of low-side injection would create an undesirable image, but the image would have a signal power that was much less than the signal power of the image caused by using high-side LO injection. By assessing the signal power of the upper image frequency and lower image frequency, the LO control circuitry can determine whether high-side injection or low-side injection should be used. In the example 550, therefore, low-side injection should be used to avoid mixing the larger interference signal ($f_{IMF}$) 552 onto the intermediate frequency ($f_{IF}$). It is noted that the signal power at other frequencies, such as harmonics of the upper and lower image frequencies, could also be assessed, if desired, in determining whether to make the dynamic selection of whether to use high-side injection or low-side injections.

Figure 5C:
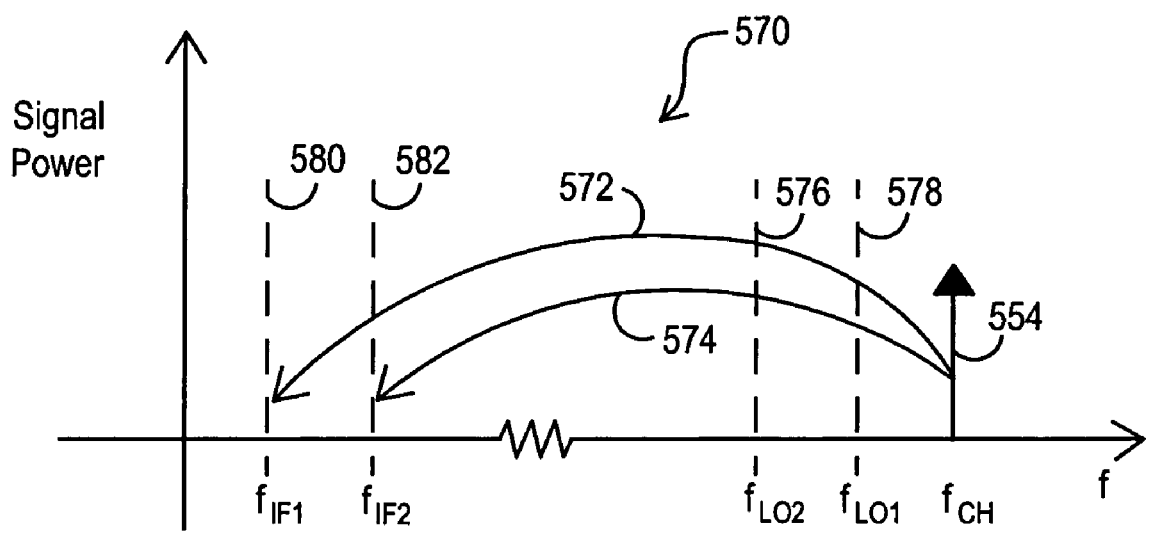
FIG. 5C is a signal diagram for another frequency control feature provided by the embodiment of FIG. 5A, namely programmable intermediate frequency (IF) locations.

FIG. 5C is a signal diagram for a programmable IF location selection feature. In the example 570, a desired channel ($f_{CH}$) to be tuned is represented by signal arrow 554, and low-side injection is being used. The LO control circuitry 500 provides programmable selection of the LO signal that will be used by mixer 104 to mix the input RF signal spectrum ($f_{RF}$) 112 to the intermediate frequency ($f_{IF}$) in accordance with the equation $f_{RF} - f_{LO} = f_{IF}$. As shown, two selectable IF target frequencies are represented by a first IF target frequency ($f_{IF1}$) 580 and a second IF target frequency ($f_{IF2}$) 582. For a given desired channel ($f_{CH}$) 554 to be tuned LO signals, therefore, a first LO signal ($f_{LO1}$) 578 is used if the first IF target frequency ($f_{IF1}$) 580 has been selected. And the line 572 represents the action of mixer 104 in mixing the desired channel ($f_{CH}$) 554 down to the first IF frequency ($f_{IF1}$) 580. Similarly, a second LO signal ($f_{LO2}$) 576 is used if the second IF target frequency ($f_{IF2}$) 582 has been selected. And the line 574 represents the action of mixer 104 in mixing the desired channel ($f_{CH}$) 554 down to the second IF frequency ($f_{IF2}$) 582.

The programmable selection for the LO signal, as shown in the embodiment 520 of FIG. 5A, is provided through an IF selection signal (IF CODE) 502 that is received by the LO control circuitry 500. This IF CODE 502 can be based, for example, upon a user programmable on-chip register. Factors for choosing the desired target IF frequency can include the channel width of the RF spectrum of interest or other environmental considerations. For example, if the integrated terrestrial broadcast receiver 520 were intended for use in a variety of countries, a different target IF frequency could be selected for each country. This selection could depend upon the nature of the broadcast spectrum in that country, including the respective channel widths. It is noted that a wide variety of mechanisms could be employed for providing programmable control to the LO control circuitry 500 to select which IF frequency is to be utilized in operation.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. A method for dynamically selecting high-side or low-side injection of local oscillator mixing signals to help reject images within a receiver, comprising:
   providing a mixer configured to utilize a mixing signal to mix an input signal to a desired frequency;
   receiving an RF signal spectrum including a plurality of channels;
   identifying a channel within the RF signal spectrum to be tuned;
   assessing signal power at one or more frequencies within the RF signal spectrum that are different from the frequency of the channel to be tuned;
   selecting high-side injection or low-side injection for the mixing signal based upon the signal power assessment;
   generating a high-side local oscillation (LO) signal if high-side injection is selected, and generating a low-side local oscillation (LO) signal if low-side injection is selected; and
   mixing the RF signal spectrum with the local oscillation signal that was selected and generated so as to mix the channel to be tuned down to the desired frequency.

2. The method of claim 1, wherein the receiving, identifying, assessing, selecting, generating and mixing steps are performed within a single integrated circuit.

3. The method of claim 1, further comprising generating two phase shifted mixing signals for use by the mixer, the mixer operating to generate I and Q output signals.

4. The method of claim 1, wherein the identifying step is conducted before the assessing step.

5. The method of claim 4, wherein the identifying, assessing and selecting steps are conducted each time a channel is tuned.

6. The method of claim 4, wherein the assessing step comprises assessing signal power at a first frequency that would be as far from the high-side LO signal, if selected, as is the channel to be tuned and assessing signal power at a second frequency that would be as far from the low-side LO signal, if selected, as is the channel to be tuned.

7. The method of claim 1, wherein the assessing step is conducted before the identifying step.

8. The method of claim 7, wherein signal power within an RF signal spectrum of interest is assessed at a plurality of frequencies across the RF signal spectrum.

9. The method of claim 1, wherein the desired frequency is a low-IF frequency.

10. The method of claim 9, wherein the receiving, identifying, assessing, selecting, generating and mixing steps are performed within a single integrated circuit.

11. The method of claim 9, wherein the desired frequency is a fixed low-IF frequency.

12. The method of claim 9, wherein the desired frequency is a variable low-IF frequency.

13. The method of claim 1, wherein the RF signal spectrum comprises an RF terrestrial audio broadcast spectrum.

14. An integrated receiver, comprising:
 a mixer coupled to receive an RF signal spectrum and a mixing signal as inputs and having a mixed signal as an output, the RF signal spectrum comprising a plurality of channels;
 local oscillator (LO) generation circuitry configured to provide an oscillation signal as an output, the oscillation signal being used to generate the mixing signal for the mixer;
 conversion circuitry coupled to receive the mixed signal from the mixer and configured to output a digital signal;
 digital-signal-processor (DSP) circuitry coupled to receive the digital signal from the conversion circuitry and configured to output a tuned digital signal, the DSP circuitry including signal power determination circuitry; and
 control circuitry coupled to the DSP and to the LO generation circuitry, the control circuitry being configured to receive signals from the signal power determination circuitry, to receive a channel selection signal, to select high-side or low-side injection based upon a signal power assessment of one or more frequencies within the RF signal spectrum, and to control the LO generation circuitry to provide a high-side LO signal or a low-side LO signal depending upon the injection selection.

15. The integrated receiver of claim 14, further comprising quadrature generation circuitry configured to generate two phase shifted mixing signals for use by the mixer, the mixer operating to generate I and Q output signals.

16. The integrated receiver of claim 14, wherein the control circuitry is configured to conduct a signal power assessment after receiving the channel selection signal, and wherein the signal power assessment comprises assessing signal power at a first frequency that would be as far from a high-side LO signal, if selected, as is the channel to be tuned and assessing signal power at a second frequency that would be as far from a low-side LO signal, if selected, as is the channel to be tuned.

17. The integrated receiver of claim 14, wherein the control circuitry is configured to conduct a signal power assessment each time a channel is tuned.

18. The integrated receiver of claim 14, wherein the control circuitry is configured to conduct a signal power assessment before receiving the channel selection signal, and wherein the signal power assessment is configured to assess signal power at a plurality of frequencies across the RF signal spectrum.

19. The integrated receiver of claim 14, wherein the mixed signal is at low-IF frequency.

20. The integrated receiver of claim 19, wherein the desired frequency is a fixed low-IF frequency.

21. The integrated receiver of claim 19, wherein the desired frequency is a variable low-IF frequency.

22. The integrated receiver of claim 14, wherein the RF signal spectrum comprises an RF terrestrial audio broadcast spectrum.

* * * * *